United States Patent [19]

Gerner

[11] Patent Number: 5,731,224
[45] Date of Patent: Mar. 24, 1998

[54] METHOD FOR MANUFACTURING OHMIC CONTACTS FOR COMPOUND SEMICONDUCTORS

[75] Inventor: Jochen Gerner, Wiesloch, Germany

[73] Assignee: Temic Telefunken microelectronic GmbH, Heilbronn, Germany

[21] Appl. No.: 365,243

[22] Filed: Dec. 28, 1994

[30] Foreign Application Priority Data

Feb. 23, 1994 [DE] Germany ............... 44 05 716.4

[51] Int. Cl.$^6$ ............... H01L 21/283; H01L 21/60
[52] U.S. Cl. ............... 437/184; 437/192; 437/194; 437/247
[58] Field of Search ............... 437/184, 192, 437/194, 247

[56] References Cited

U.S. PATENT DOCUMENTS

| | | | |
|---|---|---|---|
| 4,662,060 | 5/1987 | Aina et al. | 29/571 |
| 4,679,311 | 7/1987 | Lakhani et al. | 29/579 |
| 5,064,772 | 11/1991 | Jambotkar | 437/944 |
| 5,067,809 | 11/1991 | Tsubota | 357/17 |
| 5,250,466 | 10/1993 | Gerner et al. | 437/184 |
| 5,435,856 | 7/1995 | Rouse et al. | 136/225 |
| 5,489,829 | 2/1996 | Abrokwah et al. | 437/57 |

FOREIGN PATENT DOCUMENTS

| | | |
|---|---|---|
| 0323554 | 7/1989 | European Pat. Off. |
| 0419062 | 3/1991 | European Pat. Off. |
| 4113969 | 2/1993 | Germany. |

OTHER PUBLICATIONS

Kumar, D.: Au/AuGeNi Contacts to GaAs Formed by Rapid Electron–Beam Processing. In: Phys. Stat. Sol. (A) 139, 433, 1993. pp. 433–441.

Ball, R.K.: Improvements in the Topography of AuGeNi--Based Ohmic Contacts to n–GaAs. In: Thin Solid Films, 176, 1989, pp. 55–68.

Higman, T.K.: Structural analysis of Au–Ni–Ge and Au–Ag–Ge alloyed ohmic contacts on modulation–doped AlGaAs–GaAs heterostructurs. In: J. Appl. Phys. 60, 2, Jul. 15, 1986, pp. 677–680.

Marshall et al.: Planar Ge/Pd and alloyed Au–Ge–Ni ohmic contacts to n–$Al_xGa_{1-x}As$ ($0 \leq x \leq 0.3$). In: Appl. Phys. Letters 54 (8), Feb. 20, 1989, pp. 721–723.

Primary Examiner—David E. Graybill
Attorney, Agent, or Firm—Spencer & Frank

[57] ABSTRACT

A method for manufacturing ohmic contacts on an n-doped semiconductor layer of a III-V compound semiconductor. An AuGeNi layer is formed on the n-type III-V compound semiconductor, where the thickness of the AuGeNi layer is between 50 and 200 nm and both the germanium and the nickel concentration in the AuGeNi layer are less than 1 percent by weight. An Au layer with a thickness of between 250 and 1000 nm is applied to the AuGeNi layer. These layers are not alloyed but tempered either at a temperature between 430° and 480° C. for a period between 5 and 20 seconds or at a temperature between 360° and 400° C. for a period between 40 and 180 minutes. The metal semiconductor contact produced in this way has a low contact resistance and is free from the inhomogeneities of alloyed AuGeNi contacts.

11 Claims, 1 Drawing Sheet

METHOD FOR MANUFACTURING OHMIC CONTACTS FOR COMPOUND SEMICONDUCTORS

BACKGROUND OF THE INVENTION

The invention relates to a method for manufacturing ohmic contacts on an n-doped semiconductor layer of a III-V compound semiconductor, in particular on an n-doped semiconductor layer of $Ga_{1-x}Al_xAs$ where the relative proportion x of aluminum is in the region of ($0<x<1$).

In industrial semiconductor technology, mainly eutectic AuGe and AuGeNi alloys are used as ohmic contacts for the n-type III-V compound semiconductor crystals GaAs and GaAlAs. With gold-germanium contact layers, reproducible homogeneous contacts can be made on the binary n-type compound semiconductor gallium arsenide if the contact layer has a low germanium concentration and if the ohmic contact is formed by tempering rather than by an alloying process step. A method of this kind is described in DE 41 13 969 C2. The specific contact resistance of tempered contacts is typically of the order of $1\times10^{-5}$ $\Omega cm^2$.

Gold-germanium layers are only partly suitable as ohmic contact for the ternary n-doped semiconductor $Ga_{1-x}Al_xAs$. As the aluminum content increases, the bonding of the vapor-deposited AuGe layers deteriorates and their contact resistance rises. The natural oxide film that forms on the surface of GaAlAs permits the use of gold-germanium contacts only for $Ga_{1-x}Al_xAs$ with a relative aluminum content x in the range of $0\leq x\leq 0.4$. A multilayer contact of gold Au, germanium Ge and nickel Ni has proved suitable as contact for n-type $Ga_{1-x}Al_xAs$ with any aluminum content x. Nickel decomposes the natural oxide film on the GaAlAs surface in a solid-state reaction during the alloying process under the formation of compounds such as NiAs and β-AuGa. In the AuGeNi contacts documented in literature, gold germanium is applied either as eutectic alloy AuGe (88/12) or in discrete layers of gold and germanium. The first of these methods is described, for example, in Applied Physics Letters 54 (8), February 1989, pages 721 to 723 and in the EP 323 554 A1, and the second of these methods is described in the EP 419 062 A2. A nickel layer is then formed on the gold/germanium layer and in general has a thickness corresponding to approximately 28 nm per 100 nm AuGe (88/12).

The overall thickness of the AuGeNi contact is not critical. In most cases it is between 100 and 250 nm. If the overall thickness is reduced to below 100 nm, however, a rise in contact resistance must be expected. The order in which the layers are applied to the compound semiconductor is of no great significance because the several layers are melted and alloyed in the following thermal process. The literature therefore also documents AuGeNi contacts in the manufacture of which first nickel and then gold germanium is applied to the compound semiconductor crystal. Since the layer resistance of alloyed AuGeNi contacts is high, being typically about $2\Omega$ per square, a gold reinforcement is normally applied in addition. To form the ohmic contact, the AuGeNi layer must be subjected to thermal treatment at a temperature that lies preferably between 360° and 500° C. Because of the low melting temperature of the AuGe (88/12) eutectic of approximately 360° C., this process is an alloying process. The contact metal becomes liquid on heating and recrystallizes on cooling.

The known AuGeNi contacts have the following disadvantages. The alloying process is difficult to master technologically and results in contacts with poor morphology and irregular contact edges. Because of the discrete nickel layers, the contacts cannot be structures by etching, or only at very great expense. Dimensional accuracy can be maintained only with reservations. The structuring methods used for the known AuGeNi contacts are therefore lift-off techniques in which the undesired parts of the contact metal are lifted off with the help of an underlying photoresist structure. However, these methods are used in mass production only when no simpler and more reliable methods can be applied.

SUMMARY OF THE INVENTION

The object of the invention is, therefore, to specify a method for manufacturing ohmic contacts on an n-doped semiconductor layer of the compound semiconductor $Ga_{1-x}Al_xAs$ with any mixing ratio x where it should be possible to structure the contacts by simple etching methods. The contacts must continue to display a low contact resistance and be free of inhomogeneities. This object is solved by the method described below.

An AuGeNi film is first of all vapor-deposited on the n-doped semiconductor layer of the semiconductor crystal or sputtered on it by a cathode sputtering process. The AuGeNi film contains less than 1 percent by weight of germanium and less than 1 percent by weight of nickel. A reinforcing layer of gold is then placed on the AuGeNi film. This is done advantageously by the same process used to produce the layer below in order to prevent the formation of an oxide layer. Instead of the conventional alloying process, the method involves tempering by a rapid thermal processing method (RTP) or by a conventional tempering process in the furnace. During tempering, the AuGeNi film does not liquefy and then recrystallize as in the alloying process. The ohmic contact is created in a solid-state reaction by the diffusion of the germanium atoms from the AuGeNi layer into the surface of the n-doped layer of the III-V compound semiconductor. The contact is easy to produce and, because of the low germanium and nickel concentration, it is easy to structure without residues by the processes commonly used in semiconductor technology for gold etching.

DESCRIPTION OF THE PREFERRED EMBODIMENTS

The invention is described in more detail below on the basis of an embodiment example with reference to the Figures.

Figure 1:
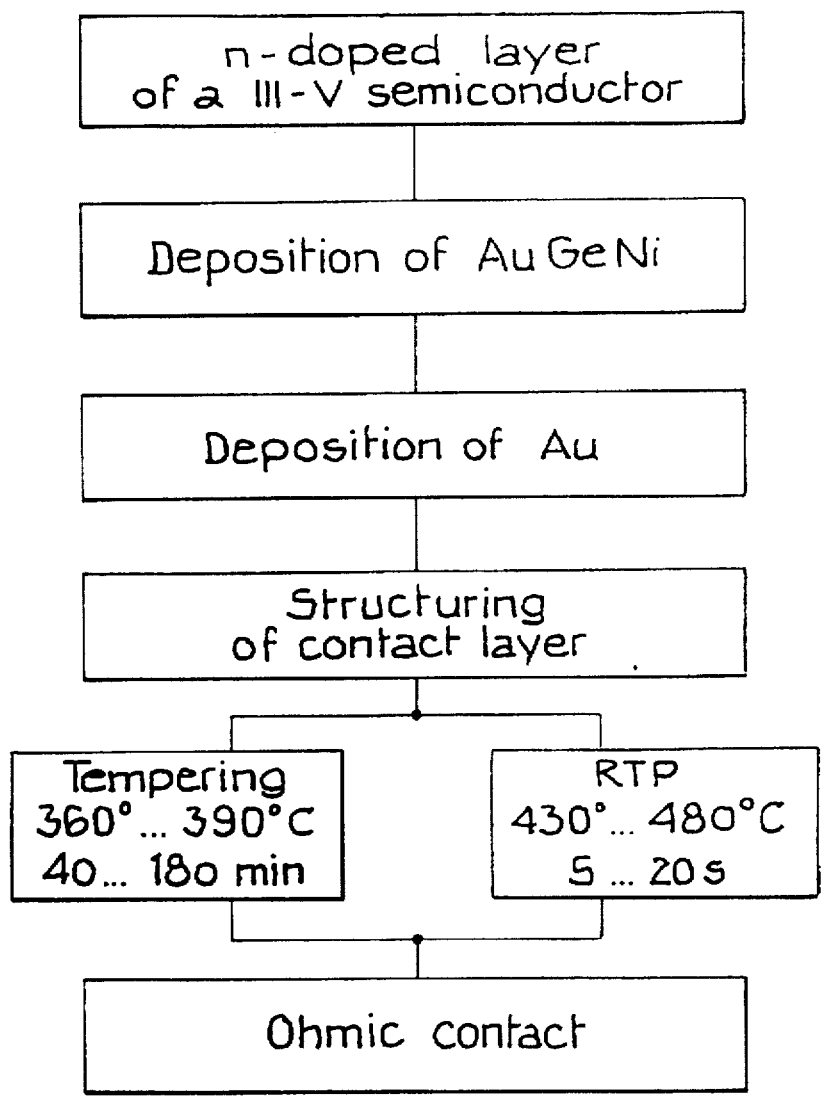
FIG. 1 shows a flowchart of a method according to the invention.

FIG. 1 shows a flowchart of a method for producing ohmic contacts on an n-doped semiconductor layer of a III-V compound semiconductor, for example $Ga_{1-x}Al_xAs$ with a relative aluminum content of x ($0\leq x\leq 1$). The method involves one step each for producing a first and a second metal layer on the front of the semiconductor crystal, and a tempering step in order to make the ohmic contact from this. In the first step of the process, the AuGeNi layer 2 is formed either by the thermal vapor-deposition from an AuGeNi source heated by an electronic beam, or by cathode sputtering on an AuGeNi target on the III-V compound semiconductor crystal 1. In the second step of the process, the Au layer 3 is formed on the AuGeNi layer 2 by the same method. The vapordeposition and cathode-sputtering processes take place at a basic pressure of approximately $2\times10^{-7}$ mbar.

Figure 2:
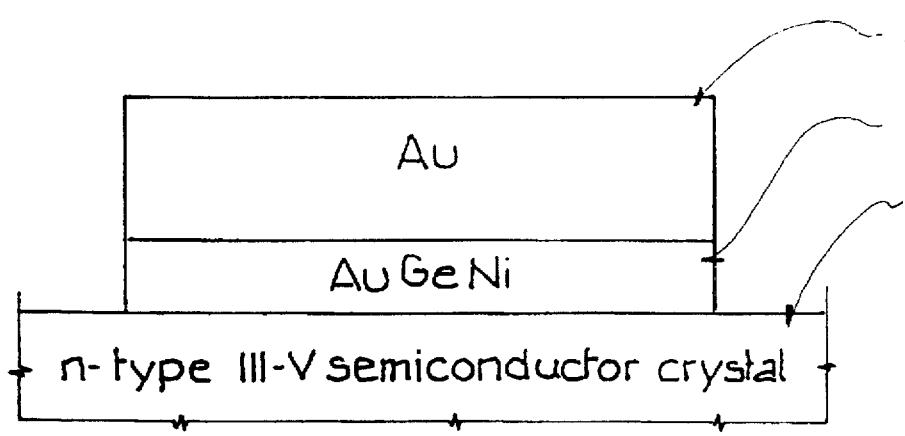
FIG. 2 shows a cross-section through the layers making up the contact before thermal treatment.

FIG. 2 shows the various layers of the ohmic contact before thermal treatment. The metal semiconductor contact comprises two layers: an AuGeNi layer 2 and an Au layer 3. The AuGeNi layer 2 is situated immediately on the n-type III-V compound semiconductor 1 and has a thickness of between 50 and 200 nm. The germanium concentration in the AuGeNi layer is approximately 0.4 percent by weight and should not exceed 1 percent by weight. The nickel concentration is in the region of 0.5 percent by weight and should also not exceed 1 percent by weight. The Au layer 3 is situated on the AuGeNi layer and has a thickness of between 250 and 1000 nm.

In the tempering step, the multiple layer contact arrangement is tempered by a so-called rapid thermal processing method at a temperature of between 430 and 480° C. for a period of between 5 and 20 seconds in order to produce the ohmic contact layer. The tempering step is performed in an inert atmosphere of an inert gas such as $N_2$ or Ar. The ohmic contact is produced by diffusion of the germanium atoms from the AuGeNi layer 2 into the surface of the n-type III-V compound semiconductor 1. Of particular importance for the process is that the time and the temperature of the tempering step are so selected that the contact layer does not melt and create the inhomogeneities known from the alloyed contact.

A conventional tempering process can be performed instead of rapid thermal processing. In this case the process temperature is between 360° and 390° C. The time taken for the tempering process is between 40 minutes and 3 hours. Here too, temperature and time are so selected that the contact layer does not melt. Tempering by the conventional process is preferably performed in an inert atmosphere of, for example, $N_2$ or Ar gas. The tempering process can, however, also be performed in a reducing atmosphere.

Examples of the n-type III-V compound semiconductor on which an ohmic contact can be produced by the method according to the invention are GaAs, $Ga_{1-x}Al_xAs$, GaP, InP and related semiconductor crystals. The method is particularly suitable for $Ga_{1-x}Al_xAs$ ($0 \leq x \leq 1$), especially when the aluminum content x is greater than 0.4.

If the contact layer is contacted by one or several bond wires of gold or aluminum, it is necessary to reinforce the contact by one or several metal layers in order to avoid damaging the contact or the semiconductor crystal during bonding. The reinforcement layer (bondpad) is preferably made of gold or aluminum. Whereas a thicker gold layer can be applied directly on the AuGeNi contact layer, an aluminum bondpad must be applied to an intermediate layer that acts as diffusion barrier. A layer of titanium tungsten nitride TiWN prevents diffusion of the aluminum from the bondpad into the contact layer. As a secondary effect, alloying of the ohmic contact and the aluminum reinforcement during the tempering step is prevented.

In a preferred embodiment, a 100 nm thick AuGeNi and a 500 nm thick Au layer are applied to the surface of a semiconductor crystal with a simple hetero structure of p-type $Ga_{0.65}Al_{0.35}As$ and n-type $Ga_{0.32}Al_{0.68}As$ that has been produced by liquid phase epitaxy on a p-type GaAs substrate and having a charge carrier concentration in the n-type epitaxy layer of $1 \times 10^{18}$ $cm^{-3}$. The AuGeNi layer has a germanium content of 0.4 percent by weight and a nickel content of 0.5 percent by weight. In a further step in the process, a 0.25 micron thick TiWN diffusion barrier is first deposited on the Au layer and this is then followed by a 2 micron thick aluminum reinforcement. The TiWN layer is sputtered on. Then the contact is structured by a wet chemical method with the help of a photoresist mask. The parts of the aluminum layer that are not required are removed, for example with phosphoric acid, those of the TiWN layer with hydrogen peroxide and those of the AuGeNi-Au layer with gold etching medium. After removing the photoresist mask, the multilayer contact arrangement is tempered by a rapid thermal processing step at 480° C. for 15 seconds. The contact produced in this way has a smooth surface and can be wire-bonded without problem. The contact resistance is approximately $5 \times 10^{-5}$ $\Omega cm^2$. The thickness of the TiWN layer preferably is between 100 and 500 nm, and the thickness of the Al layer is between 1 and 3 microns.

What is claimed is:

1. Method for producing ohmic contacts on an n-doped semiconductor layer of a III-V compound semiconductor, in which initially a metallic contact layer is applied to the n-doped semiconductor layer, a gold layer is applied to the metallic contact layer, and finally the layer arrangement obtained in this way is tempered in a thermal process step which does not melt the metallic contact layer, and wherein the metallic contact layer is formed of AuGeNi produced from an AuGeNi source with neither the germanium content nor the nickel content exceeding 1 percent by weight.

2. Method in accordance with claim 1, wherein the various layers are tempered at 360° to 390° C. for a period of 40 to 180 minutes during the thermal process step.

3. Method in accordance with claim 1, wherein the arrangement is tempered at a temperature of 430° to 480° C. for a period of 5 to 20 seconds during the thermal process step.

4. Method in accordance with claim 1, wherein the nickel content in the AuGeNi layer is 0.5 percent by weight.

5. Method in accordance with claim 1, wherein the germanium content in the AuGeNi layer is 0.4 percent by weight.

6. Method in accordance with claim 4, wherein the AuGeNi layer has a thickness of between 50 and 200 nm.

7. Method in accordance with claim 1, wherein the Au layer has a thickness of between 250 and 1000 nm.

8. Method in accordance with claim 1, wherein a TiWN layer is initially deposited on the Au layer covering the AuGeNi layer before the thermal process step and then an Al layer is deposited on the TiWN layer.

9. Method in accordance with claim 8, wherein the thickness of the TiWN layer is between 100 and 500 nm.

10. Method in accordance with claim 9, wherein the thickness of the aluminum layer is between 1 and 3 microns.

11. Method in accordance with claim 1, wherein the contact layer arrangement is structured before the thermal processing step.

* * * * *